United States Patent [19]

Koblinger et al.

[11] Patent Number: 4,980,317

[45] Date of Patent: Dec. 25, 1990

[54] METHOD OF PRODUCING INTEGRATED SEMICONDUCTOR STRUCTURES COMPRISING FIELD-EFFECT TRANSISTORS WITH CHANNEL LENGTHS IN THE SUBMICRON RANGE USING A THREE-LAYER RESIST SYSTEM

[75] Inventors: Otto Koblinger, Korntal-Muenchingen; Reinhold Mühl, Altdorf; Hans-Joachim Trumpp, Filderstadt, all of Fed. Rep. of Germany

[73] Assignee: International Business Machines Corporation, Armonk, N.Y.

[21] Appl. No.: 326,352

[22] Filed: Mar. 21, 1989

[30] Foreign Application Priority Data

Apr. 19, 1988 [EP] European Pat. Off. ........ 88106205.3

[51] Int. Cl.$^5$ ..................... H01L 21/00; H01L 21/02; H01L 21/306; H01L 21/308
[52] U.S. Cl. .................................. 437/228; 437/225; 437/229; 437/235; 148/DIG. 51; 148/DIG. 137; 156/643; 156/646; 156/657; 156/659.1; 156/660; 156/661.1
[58] Field of Search ............... 437/225, 228, 229, 235; 204/192.32, 192.34, 192.35; 156/643, 646, 657, 659.1, 660, 661.1; 148/DIG. 50, DIG. 51, DIG. 137

[56] References Cited

U.S. PATENT DOCUMENTS

| | | | |
|---|---|---|---|
| 3,201,239 | 8/1965 | Neugebauer et al. | 96/36 |
| 3,770,433 | 11/1973 | Bartel et al. | 96/36 |
| 4,209,349 | 6/1980 | Ho et al. | 156/657 |
| 4,209,350 | 6/1980 | Ho et al. | 156/657 |
| 4,234,362 | 11/1980 | Riseman | 148/187 |
| 4,244,799 | 1/1981 | Fraser et al. | 204/192.32 |
| 4,256,514 | 3/1981 | Pogge | 156/643 |
| 4,397,937 | 8/1983 | Clecak et al. | 430/192 |
| 4,502,914 | 3/1985 | Trumpp et al. | 156/643 |
| 4,589,952 | 5/1986 | Behringer et al. | 156/653 |

FOREIGN PATENT DOCUMENTS

| | | |
|---|---|---|
| 0098318 | 1/1984 | European Pat. Off. . |
| 0146789 | 7/1985 | European Pat. Off. . |
| 8000639 | 4/1980 | World Int. Prop. O. . |

OTHER PUBLICATIONS

Grescher, Jr., Lithographic Method for Defining Edge Angles, IBM Tech. Dis. Bull., vol. 25, No. 11B, 4/1983, pp. 6185-6186.

Helbert, J. N., et al. "Intralevel Hybrid Resist Process for the Fabrication of Metal Oxide Semiconductor Devices with Submicron Gate Lengths", Optical Engineering, vol. 22, No. 2 (Mar.-Apr. 1983), pp. 185–189.
Caro, J., et al., "Submicron Gate Level Process Step Using E-Beam Lithography", Microelectronic Engineering, vol. 3 (1985), pp. 519–524.

Primary Examiner—Brian E. Hearn
Assistant Examiner—B. Everhart
Attorney, Agent, or Firm—William D. Sabo

[57] ABSTRACT

Disclosed is a method of producing an integrated semiconductor structure, comprising components with dimensions in the submicron range, wherein a three-layer resist system is used to produce a polymer or resist mask. The polymer or resist mask thus produced is used to etch a layer of polysilicon on the semiconductor substrate. The method is characterized in that the pattern, produced conventionally in the top layer of the three-layer resist and including an angle < about 90°, is transferred by RIE, using CF$_4$, to the center layer of plasma nitride and by RIE, using oxygen, to the bottom resist or polymer layer. In a prior art method, this was followed by lateral etching in oxygen to reduce the dimensions of the mask by a desired amount. The improved method of the invention provides for the plasma nitride mask to be removed first, using, if necessary a facetting step in oxygen to increase the positive angle in the mask structure, and then for the latter structure to be laterally etched in oxygen to reduce its dimensions by the desired amount. As the angle in the mask is < about 90°, the parameters for lateral etching may be chosen such that the etch process is largely anisotropic and, thus, accurately and readily determinable. As a result, the absolute amount of lateral etching may be accurately adjusted during the etch period. As shading plasma nitride is removed before lateral etching, the influence of neighboring structures on lateral etching is largely reduced. The mask thus produced is used to etch in the polysilicon layer structures whose angles ensure a good definition of the spacers to be produced in the subsequent process steps and of ion implantation, which both determine the effective channel length of field-effect transistors.

18 Claims, 3 Drawing Sheets

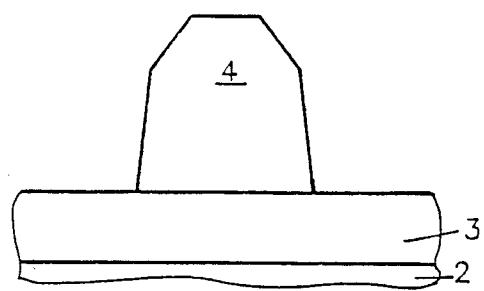
FIG. 3D
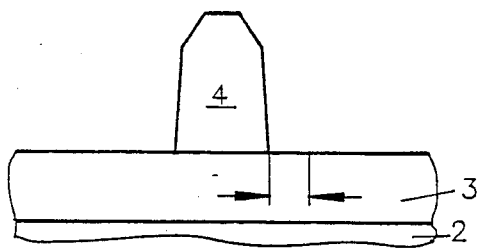
FIG. 3E
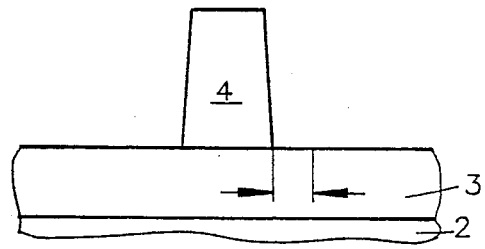
FIG. 4E
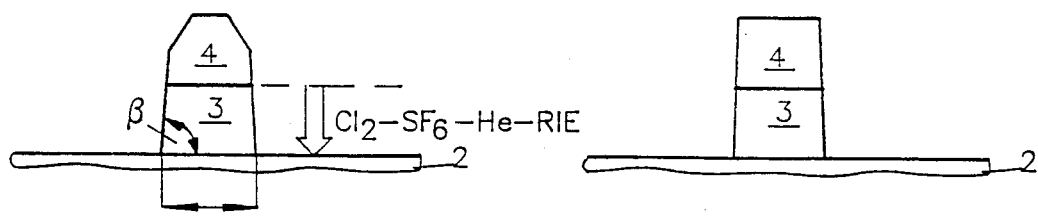
FIG. 3F
FIG. 4F

METHOD OF PRODUCING INTEGRATED SEMICONDUCTOR STRUCTURES COMPRISING FIELD-EFFECT TRANSISTORS WITH CHANNEL LENGTHS IN THE SUBMICRON RANGE USING A THREE-LAYER RESIST SYSTEM

DESCRIPTION

1. Field of the Invention

This invention relates to a method of producing integrated semiconductor structures comprising field-effect transistors with channel lengths in the submicron range.

2. Background of the Invention

In modern semiconductor technology, it is desirable to have line widths of about 0.5 μm, which are obtained by standard photolithographic processes, rather than more complex technologies, such as electron beam or x-ray lithography. In the past few years, considerable effort has been expended on developing processes for the production of field-effect transistors with channel lengths in the submicron range, while maintaining very close channel length tolerances. Examples of such effort are described in U.S. Pat. Nos. 4,209,349; 4,209,350; 4,234,362; 4,256,514 and 4,502,914. All these patents describe methods of producing a silicon body with substantially horizontal and substantially vertical surfaces on which a very thin layer is deposited. In an anisotropic etch process, using, for example, reactive ion etching, the layer on the substantially horizontal surface is removed, while the layer on the substantially vertical surface is retained. The dimensions of the vertical layer are essentially dependent on the thickness of the originally applied layer. In this manner, a range of very small dimensions is obtainable, such as a field-effect transistor channel with a length in the submicron range.

Another method uses a three-layer resist system to define the gate electrode of a field-effect transistor by photo- or electron beam lithography. According to this method (see, for example, PCT application No. WO-80/00639), a relatively thick polymer or resist layer is applied as a base layer to the surface of a polycrystalline silicon layer, part of which serves as a gate electrode. After a curing step, an intermediate layer of silicon dioxide or nitride is applied by chemical vapor deposition. In the upper-most layer, which consists of a highly sensitive positive or negative photoresist, the desired pattern of the gate electrode is produced by optical or electron beam exposure and development. This pattern is transferred from the upper resist layer to the silicon dioxide or nitride barrier layer by reactive ion etching or plasma etching with $CF_4$, $CHF_3$, mixed, if necessary, with $O_2$ and the like. By reactive ion etching with $O_2$, the pattern is transferred to the bottom polymer or resist layer. In this etch step, a relatively high oxygen pressure of about 50 to 70 μbar is used to laterally undercut the silicon dioxide/nitride barrier layer by, for example, about 0.2 μm either side. The photoresist bars in the bottom layer, which have been reduced over the original line width of the top resist layer by lateral undercutting, serve as a mask for the polysilicon in the subsequent reactive ion etch step.

The disadvantage of this method is its poor uniformity. It has been found, for example, that the bases of the photoresist bars are not very accurately defined and that on chips their widths vary considerably from the center of the wafer to its edge. In addition, the amount of average lateral etching is limited to a particular value by the geometry of the desired structures, and the etch rate for lateral etching is not constant with time. Moreover, during etching, the influence of adjacent structures is enhanced by the overhang of the silicon dioxide/nitride barrier layer. A further disadvantage of this method is that during reactive ion etching, the barrel shape of the photoresist bars produces a negative angle in the polysilicon, which, during the subsequent formation of the spacers by deposition and reactive ion etching and during ion implantation of the source and drain regions, leads to considerable fluctuations in the effective channel lengths of FETs.

SUMMARY OF THE INVENTION

It is, therefore, an object of the invention to provide an improved method, in which a three-layer resist is used to produce a resist or polymer mask and in which the dimensions of the photoresist mask of the top layer are transferred with great accuracy to the lower resist or polymer layer and the line widths of the resist or polymer mask thus produced may be reduced in a predetermined manner by lateral etching. During subsequent reactive ion etching of polysilicon, the resist or polymer mask serves as a mask and permits the formation of a positive angle in the polysilicon, which is highly desirable both for good definition of the spacers along the polysilicon edges and during ion implantation.

Now, there is provided an improved method of producing an integrated semiconductor structure, comprising components in the submicron range, wherein: three layers are deposited on a semiconductor substrate, the bottom layer being of a photoresist or polymer material and in contact with the upper surface of the substrate, the intermediate layer being of silicon nitride and in contact with the upper surface of the bottom layer, and the upper layer being of a highly sensitive photoresist and in contact with the upper surface of the intermediate layer; a desired mask pattern is generated in the upper layer and transferred by reactive ion etching (RIE) or plasma etching to the silicon nitride layer and to the photoresist or polymer layer; and the resulting mask in the photoresist or polymer layer is used to etch the semiconductor substrate. In accordance with the method, the pattern is transferred to the silicon nitride layer by RIE or plasma etching and to the photoresist or polymer layer by RIE, using oxygen; the silicon nitride layer is removed by RIE or plasma etching; and the dimensions of the resulting mask in the photoresist or polymer layer are reduced by a desired amount by lateral etching.

The foregoing and other objects, features and advantages of the invention will be apparent from the following more particular description of the preferred embodiments of the invention, as illustrated in the accompanying drawings.

BRIEF DESCRIPTION OF THE DRAWINGS

FIGS. 3A-3F show a preferred embodiment of the method according to the invention.

DESCRIPTION OF THE PREFERRED EMBODIMENTS

Figure 1:
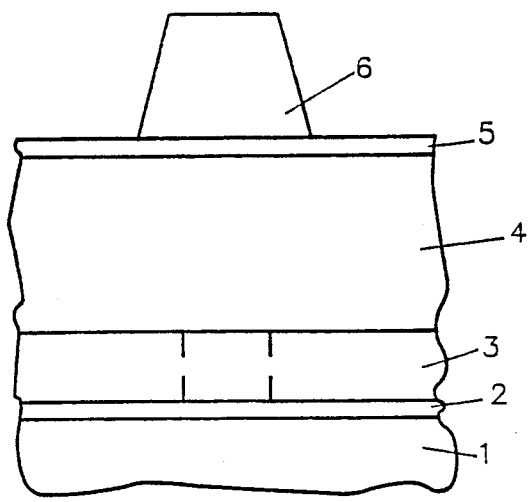
FIG. 1 shows a three-layer structure for producing a resist or polymer mask.

Referring now to FIG. 1, the layer structure shown forms the basis for a prior art method and the method according to the invention.

For producing the layer structure, an insulating layer 2 is applied to a VLSI substrate 1 of silicon. This layer may consist of thermally grown silicon dioxide, and part of it may be provided on the substrate as a gate dielectric. The layer may also consist of silicon dioxide, silicon nitride or the like, or, for example, of a combination of silicon nitride and silicon dioxide. The silicon dioxide layer is preferably thermally grown in an oxygen or oxygen/water ambient at a temperature of about 800° C. A silicon nitride layer is usually produced by chemical vapor deposition, using an $SiH_4/NH_3$ gas mixture with $N_2$ as a carrier gas at a temperature of about 800° C. at atmospheric pressure, or under vacuum conditions. In the layer structure of FIG. 1, the insulating layer 2 consists of, for example, silicon dioxide with a layer thickness of about 13 nm. In the regions in which the field-effect transistors are to be formed, the surface conductivity of the P− substrate 1 is set to a particular threshold value $V_t$ by ion implantation.

Then, a polycrystalline silicon layer 3 is deposited on the entire surface of the silicon dioxide layer 2, using silane in an oxygen ambient, at a temperature ranging from about 600° C. to about 650° C., preferably at a temperature of about 625° C. The thickness of the deposited polysilicon layer 3 is about 400 to about 500 nm, preferably about 430 nm. The entire surface of the layer 3 is doped by implanting phosphorus or arsenic, and the substrate is subsequently heated to about 900° C.

For producing the photoresist or polymer mask, an about 1 to about 2 $\mu m$ thick polymer or resist layer 4 is deposited on the surface of the polysilicon layer 3 by spinning or spraying, followed by a curing step at about 200° C. for about 30 min. There are numerous materials of which the layer 4 may be produced. Suitable materials are known positive and negative photoresist materials, such as the usual phenol-formaldehyde novolak resins, polymethyl methacrylate, polyisoprenes or materials such as those described in U.S. Pat. Nos. 3,201,239 and 3,770,433. Layer 4 may also be produced from polymer materials which are not photoconductive, such as polyimides.

According to the method of the invention, layer 4 preferably consists of TNS photoresist, as described in U.S. Pat. No. 4,397,937, which is based on a phenolic resin and a diester of a 1-oxo-2-diazonaphthalene sulfonic acid with an unsymmetrical primary or secondary alphatic diol as a sensitizer. The layer thickness is about 1.1 $\mu m$. Layer 4 is cured under the above-mentioned conditions.

Then, a silicon nitride layer 5 with a thickness of about 0.1 $\mu m$ is deposited on the layer 4 as an etch barrier for reactive ion etching with oxygen. The silicon nitride is applied by plasma deposition from an ambient containing silane, ammonia and argon at a pressure of about 1 mbar, a deposition temperature of about 200° C. and an energy density of about 0.05 $Watt/cm^2$.

On the plasma silicon nitride layer 5, a photoresist layer 6 with a thickness of about 0.5 $\mu m$ to about 1.0 $\mu m$ is deposited as an upper-most layer. For the method according to the invention, that layer preferably consists of the same photoresist as the resist layer 4. It may also consist of another highly radiation-sensitive photoresist. Utilizing a known method, the desired mask pattern is produced by exposure to a wavelength of 436 nm, followed by a curing step in nitrogen at a temperature ranging from about 95° to about 105° C. for about 30 min., and by development in an aqueous AZ developer based on tetramethyl ammonium hydroxide.

Figure 2A:
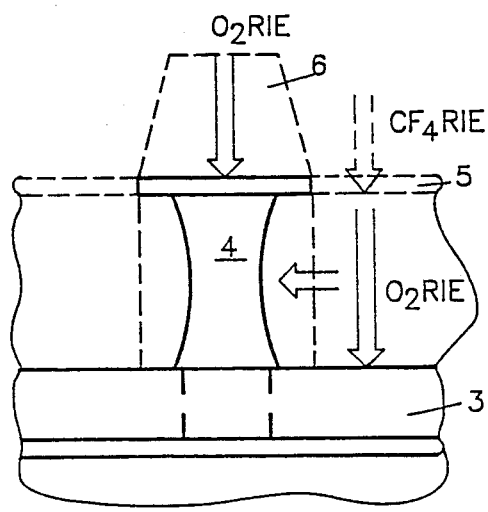
FIGS. 2A-2B show a prior art method.
Figure 2B:
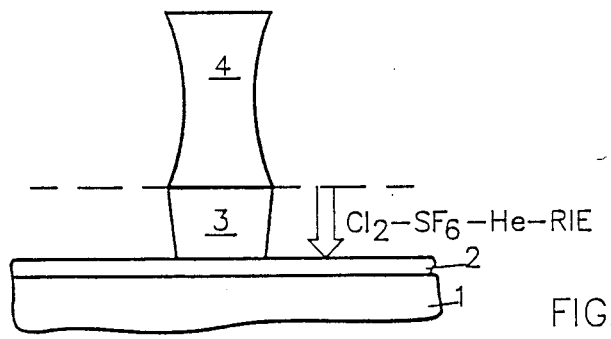

Referring now to FIGS. 2A and 2B, the pattern of the photoresist mask 6 is then transferred by a dry etch process to the nitride layer 5 and to the resist layer 4, with holes in the silicon nitride layer 5 (FIG. 2A) being produced by plasma etching with $CF_4$ at a flow rate of about 20 to about 50 sccm, a pressure of about 30 to about 60 $\mu bar$ and an energy density of about 0.3 to about 0.5 $Watt/cm^2$, and overetching amounting to about 30%. The etch endpoint is determined by laser interference. The layer 5 with the etched openings serves as a mask for etching the resist or polymer layer 4. In the prior art method, a relatively high pressure of about 50 to 70 $\mu bar$ was used for the reactive ion etch step of this layer, in order to laterally undercut the silicon nitride layer 5 by a desired amount. In that etch step, the resist layer 4 is anisotropically, i.e., perpendicularly, etched. At the same time, the nitride mask 5 is laterally undercut as a result of the isotropic constituents of the etch medium, yielding photoresist structures in the bottom layer 4, which are reduced over the original line width in the top layer 6. During the etching of layer 4, the entire resist mask 6 is removed from the nitride mask 5.

As previously mentioned, that method is highly disadvantageous with respect to the uniformity of etching, in that the desired tolerances for the width of the photoresist structures are not always obtained. A further serious disadvantage is that the barrel shape of the photoresist bars resulting from the lateral undercutting of the nitride mask 5 adversely affects the subsequent etch of the polysilicon layer 3. During the reactive ion etching of the polysilicon layer 3 (FIG. 2B), with the aid of $Cl_2/SF_6/He$, for example, the use of such a photoresist mask leads to a negative angle in the polysilicon, which is undesirable with respect to the properties of the FETs.

In contrast to the previously described prior art method, a multi-step etch method has been developed which permits an extremely accurate control of the lateral etching of the photoresist structures 4 (FIGS. 3A–F and 4A–F).

The newly developed method proceeds from the layer structure shown in FIG. 1. As previously described, the photoresist mask 6 of TNS resist is produced by conventional exposure and development in a liquid developer, forming a positive resist angle ranging from about 75° to about 85°. All dry etch steps may be effected either in a parallel plate reactor, a plasma etch unit or a hexode of, for example, type AME 8121. The parameters of the individual etch steps depend upon the equipment used in the steps, respectively.

Figure 3A:
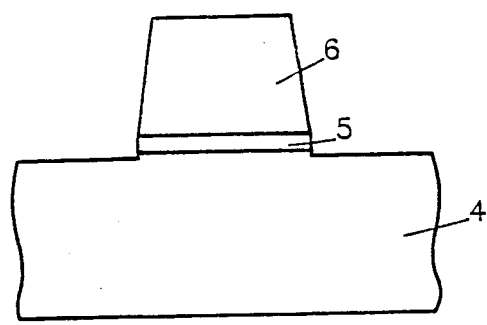
Figure 4A:
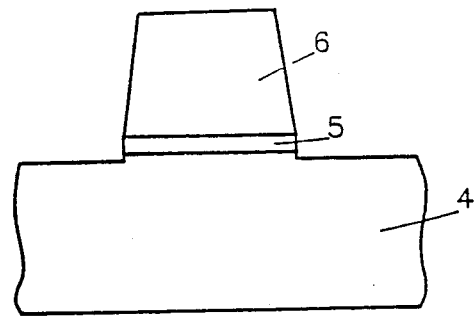
FIGS. 4A-4B show another preferred embodiment of the method according to the invention.
Figure 3B:
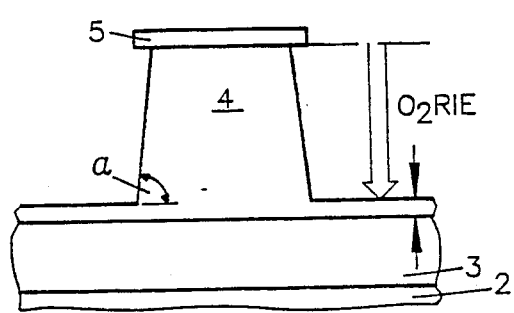
Figure 4B:
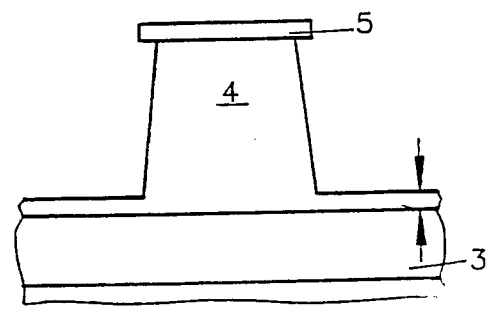
Figure 3C:
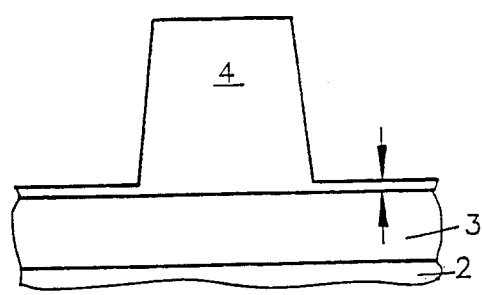
Figure 4C:
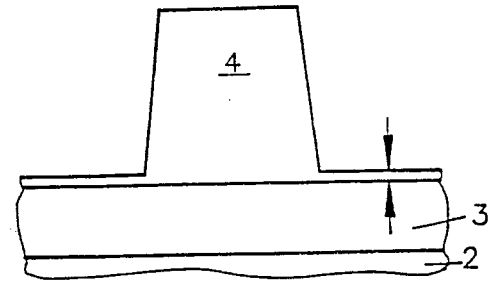

The method of the invention uses the nitride layer 5 (FIGS. 3A and B and 4A and B) merely to etch an angle of about 80° to about 85° C. in the underlying photoresist 4 at the positions defined by the photoresist mask 6 (FIGS. 3A, 4A). Subsequently, the nitride layer 5 is removed by reactive ion etching. The positive angle of the photoresist structure 4 may be enhanced by a facetting step in oxygen before the photoresist structure 4 is laterally etched in oxygen, which is essential for obtaining the desired reduction. In that step, the photoresist angle of <90° permits choosing the conditions for reactive ion etching in oxygen such that etching is substantially anisotropic, which is more accurate than isotropic etching under an overhang of the nitride layer 5, and which is, therefore, accurately controllable as a function of the etch time. In addition, the influence of contiguous structures on lateral etching is considerably reduced, as there is no shading nitride.

In the practice of the method of the invention, the photoresist structure was laterally etched by about 0.75 $\mu$m with a 3 sigma-tolerance (sigma=standard deviation) of only about +0.08 $\mu$m across the individual wafer and about +0.12 $\mu$m across the entire package of 16 wafers, i.e., the tolerance of about +0.1 $\mu$m produced by photolithography was not increased significantly.

The photoresist mask with angles of about < about 90° and photoresist bars reduced by the desired amount was subsequently used to generate by reactive ion etching in polysilicon 3 a pattern with positive angles and the desired line widths, which is highly desirable in view of the required properties of the FETs.

According to a specific embodiment of the invention, the layer structure of FIG. 1 with the photoresist mask 6 produced in a conventional manner is subjected in a type AME 8121 hexode to a series of dry etch steps.

The nitride layer 5 of the layer structure, consisting of a 0.8 $\mu$m thick photoresist mask 6 on a 0.1 $\mu$m thick nitride layer 5, a 1.1 $\mu$m thick photoresist layer 4 and a 430 nm thick polysilicon layer 3, is etched under the following conditions (FIG. 3A):

| | |
|---|---|
| CF$_4$ flow | 20 to 50 sccm; |
| pressure | 30 to 60 $\mu$bar; |
| energy density with 30% overetching | 0.3 to 0.5 Watt/cm$^2$; |

The photoresist layer 4 is anisotropically etched under the following conditions (FIG. 3B):

| | |
|---|---|
| O$_2$ flow | 40 to 60 sccm; |
| pressure | 8 to 12 $\mu$bar; |
| energy density | 0.2 to 0.4 Watt/cm$^2$. |

Etching stops at a photoresist thickness of about 0.2 $\mu$m before the endpoint.

Then, the nitride layer 5 is etched off under the following conditions (FIG. 3C):

| | |
|---|---|
| CF$_4$ flow | 20 to 50 sccm; |
| pressure | 30 to 60 $\mu$bar; |
| energy density | 0.3 to 0.5 Watt/cm$^2$. |

At the same time, about 0.1 $\mu$m of the photoresist layer 4 is etched.

If desired, a facetting step is carried out under the following conditions (FIG. 3D):

| | |
|---|---|
| O$_2$ flow | 15 to 25 sccm; |
| pressure | °1 $\mu$bar; |
| energy density | 0.2 to 0.4 Watt/cm$^2$. |

The remaining 0.1 $\mu$m of the photoresist layer 4 is etched off in this step.

Then, lateral etching is carried out under the following conditions to reduce the width of the photoresist structure 4 (FIG. 3E):

| | |
|---|---|
| O$_2$ flow | 80 to 120 sccm; |
| pressure | 90 to 100 $\mu$bar; |
| energy density | 0.2 to 0.4 Watt/cm$^2$. |

The duration of this etch step determines the amount of lateral etching. At a duration of about 1.6 min., about 0.3 $\mu$m is etched on either side of the photoresist structure.

Finally, by using the photoresist mask 4, the polysilicon layer 3 is etched in a parallel plate reactor or in a hexode under the following conditions (FIG. 3F):

| | |
|---|---|
| etch medium | Cl$_2$/SF$_6$/He 7.5 2.5 90% vol. %; |
| flow | 35 to 45 sccm; |
| pressure | 40 to 60 $\mu$bar; |
| reduced energy density | 0.05 to 0.1 Watt/cm$^2$. |

Depending on the angle in the photoresist mask 4, an angle of < about 90° is obtained in the polysilicon layer 3.

To demonstrate the high degree of accuracy of the lateral etch process (FIG. 3E), an effort has been made to determine by way of a wafer package the contribution of photolithography to the 3 sigma tolerances, i.e., to separate the variations of the original widths of resist structures from the contribution of reactive ion etching. For this purpose, all even-numbered wafers of a package of 10 were etched perpendicularly through the nitride layer 5 and the photoresist layer 4 to transfer the original widths of the resist structures to the polysilicon 3. All odd-numbered wafers were subjected to a lateral etch step in oxygen of about 0.45 $\mu$m prior to the reactive ion etching of the polysilicon 3. The 3 sigma tolerance of about 0.1 $\mu$m obtained electrically was identical for both packages. Variations in the original width of the resist structures of 0.1 $\mu$m across the individual wafer were almost exclusively attributable to photolithography and development, which could be confirmed by numerous SEM measurements. This proves that in practice the lateral etch process does not contribute to the 3 sigma tolerances and that the latter are attributable to the previously mentioned photolithography and to development.

In a further embodiment (FIGS. 4A to 4F), the individual etch steps were carried out fully automatically, one after the other, in a hexode. In that embodiment, a special facetting step (FIG. 3D in the previous embodiment) was not carried out before lateral etching. By means of the fully automatic method, a photoresist structure 4 with almost perpendicular edges can be produced, which, when transferred to the polysilicon layer 3, yields an edge angle of about 90°. The advantages of the method of the invention are also obtained with this embodiment.

While the invention has been particularly shown and described with reference to preferred embodiments thereof, it will be understood by those skilled in the art that various changes in form and details may be made therein without departing from the spirit and scope of the invention.

What is claimed is:

1. A method of producing an integrated semiconductor structure, comprising components with dimensions in the submicron range, comprising:
   (a) depositing three layers on a semiconductor substrate, the bottom layer being of a photoresist or polymer material and in contact with the upper surface of said substrate, the intermediate layer being of silicon nitride and in contact with the upper surface of said bottom layer, and the upper layer being of a highly sensitive photoresist and in contact with the upper surface of said intermediate layer;
   (b) generating a desired mask pattern in said upper layer and transferring the pattern by RIE or plasma etching to said silicon nitride layer;
   (c) transferring the pattern to said photoresist or polymer layer by RIE, using oxygen, said silicon nitride layer serving as a mask;
   (d) removing said patterned silicon nitride layer by RIE or plasma etching;
   (e) laterally etching, after removal of said silicon nitride layer, to reduce the dimensions of the resulting mask in said photoresist or polymer layer by a desired amount, said lateral etching being substantially anisotropic and controllable as a function of time and with $O_2$ at a gas flow of about 80 to about 120 sccm, a pressure of about 90 to about 100 $\mu$bar, and an energy density of about 0.2 to about 0.4 Watt/cm$^2$; and
   (f) etching said semiconductor substrate using the resulting mask in said photoresist or polymer layer.

2. The method of claim 1, wherein, before the resulting mask in said photoresist or polymer layer is laterally etched, it is subjected to a facetting step in oxygen.

3. The method of claim 1, wherein the RIE steps are carried out in the same equipment.

4. The method of claim 3, wherein the RIE steps are carried out in a parallel plate reactor or in a hexode.

5. The method of claim 1, wherein said silicon nitride layer is etched with CF$_4$, using a gas flow of about 20 to about 50 sccm, a pressure of about 30 to about 60 $\mu$bar and an energy density of about 0.3 to about 0.5 Watt/cm$^2$.

6. The method of claim 1, wherein said photoresist or polymer layer is etched with oxygen at a pressure of < about 12 $\mu$bar, yielding angles of about 80° to about 85° in the mask in said photoresist or polymer layer.

7. The method of claim 6, wherein said photoresist or polymer layer is anisotropically etched with $O_2$, using a gas flow of about 40 to about 60 sccm, a pressure of about 8 to about 12 $\mu$bar, and an energy density of about 0.2 to about 0.4 Watt/cm$^2$.

8. The method of claim 7, wherein for increasing the positive angle, the mask in said photoresist or polymer layer is subjected to a facetting step in oxygen, using a gas flow of about 15 to about 25 sccm, a pressure of < about 1 $\mu$bar, and an energy density of about 0.2 to about 0.4 Watt/cm$^2$.

9. The method of claim 1, wherein after removal of said silicon nitride layer, the mask in said photoresist or polymer layer is laterally etched at an oxygen pressure of about 100 $\mu$bar for a predetermined time to reduce its dimensions by a predetermined amount.

10. The method of claim 1, wherein the mask in said photoresist or polymer layer is used to etch a structure with angles < about 90° into said semiconductor substrate.

11. The method of claim 10, wherein said substrate comprises polysilicon, and further wherein a mixture, in volume per cent, of about 6 to about 8% SF$_6$, about 2 to about 3% Cl$_2$, with the remainder helium, is used to RIE etch said substrate.

12. The method of claim 1, wherein said bottom layer is based on a phenolic resin and a diester of a 1-oxo-2-diazonaphthalene sulfonic acid with an unsymmetrical primary or secondary alphatic diol as a sensitizer.

13. The method of claim 12, wherein said upper layer is of the same material as said bottom layer.

14. The method of claim 13, wherein said bottom layer has a thickness of about 1.1 $\mu$m, said intermediate layer has a thickness of about 0.1 $\mu$m and said upper layer has a thickness of about 0.8 $\mu$m.

15. A method of producing an integrated semiconductor structure, comprising components with dimensions in the submicron range, comprising:
   (a) depositing three layers on a semiconductor substrate, the bottom layer being of a photoresist or polymer material and in contact with the upper surface of said substrate, the intermediate layer being of silicon nitride and in contact with the upper surface of said bottom layer, and the upper layer being of a highly sensitive photoresist and in contact with the upper surface of said intermediate layer;
   (b) generating a desired mask pattern in said upper layer and transferring the pattern by RIE or plasma etching to said silicon nitride layer with CF$_4$, using a gas flow of about 20 to about 50 sccm, a pressure of about 30 to about 60 $\mu$bar, and an energy density of about 0.3 to about 0.5 Watt/cm$^2$;
   (c) transferring the pattern to said photoresist or polymer layer by RIE, using oxygen, said silicon nitride layer serving as a mask;
   (d) removing said patterned silicon nitride layer by RIE or plasma etching with CF$_4$, using a gas flow of about 20 to about 50 sccm, a pressure of about 30 to about 60 $\mu$bar, and an energy density of about 0.3 to about 0.5 Watt/cm$^2$;
   (e) laterally etching, after removal of said silicon nitride layer, to reduce the dimensions of the resulting mask in said photoresist or polymer layer by a desired amount, said lateral etching being substantially anisotropic and controllable as a function of time; and
   (f) etching said semiconductor substrate using the resulting mask in said photoresist or polymer layer.

16. A method of producing an integrated semiconductor structure, comprising components with dimensions in the submicron range, comprising:
   (a) depositing three layers on a semiconductor substrate, the bottom layer being of a photoresist or polymer material and in contact with the upper surface of said substrate, the intermediate layer being of silicon nitride and in contact with the upper surface of said bottom layer, and the upper layer being of a highly sensitive photoresist and in contact with the upper surface of said intermediate layer;
   (b) generating a desired mask pattern in said upper layer and transferring the pattern by RIE or plasma etching to said silicon nitride layer;
   (c) transferring the pattern to said photoresist or polymer layer by RIE, said silicon nitride layer serving as a mask, said photoresist or polymer layer being anisotropically etched with oxygen, using a gas flow of about 40 to about 60 sccm, a pressure of about 8 to about 12 μbar, and an energy density of about 0.2 to about 0.4 Watt/cm$^2$, yielding angles of about 80° to about 85° in the mask in said photoresist or polymer layer;

(d) removing said patterned silicon nitride layer by RIE or plasma etching;

(e) laterally etching, after removal of said silicon nitride layer, to reduce the dimensions of the resulting mask in said photoresist or polymer layer by a desired amount, said lateral etching being substantially anisotropic and controllable as a function of time; and (f) etching said semiconductor substrate using the resulting mask in said photoresist or polymer layer.

17. The method of claim 16, wherein for increasing the positive angle, the mask in said photoresist or polymer layer is subjected to a facetting step in oxygen, using a gas flow of about 15 to about 25 sccm, a pressure of < about 1 μbar, and an energy density of about 0.2 to about 0.4 Watt/cm$^2$.

18. A method of producing an integrated semiconductor structure, comprising components with dimensions in the submicron range, comprising:

(a) depositing three layers on a semiconductor substrate, the bottom layer being of a photoresist or polymer material and in contact with the upper surface of said substrate, the intermediate layer being of silicon nitride and in contact with the upper surface of said bottom layer, and the upper layer being of a highly sensitive photoresist and in contact with the upper surface of said intermediate layer;

(b) generating a desired mask pattern in said upper layer and transferring the pattern by RIE or plasma etching to said silicon nitride layer;

(c) transferring the pattern to said photoresist or polymer layer by RIE, using oxygen, said silicon nitride layer serving as a mask;

(d) removing said patterned silicon nitride layer by RIE or plasma etching;

(e) laterally etching, after removal of said silicon nitride layer, to reduce the dimensions of the resulting mask in said photoresist or polymer layer by a desired amount, said lateral etching being substantially anisotropic and controllable as a function of time; and (f) etching a structure with angles < about 90° into said semiconductor substrate using the resulting mask in said photoresist or polymer layer, wherein said substrate comprises polysilicon and a mixture, in volume per cent, of about 6 to about 8% SF$_6$, about 2 to about 3% Cl$_2$, with the remainder helium is used to RIE etch said substrate.

* * * * *